United States Patent
Hamilton et al.

(10) Patent No.: US 7,652,919 B2
(45) Date of Patent: Jan. 26, 2010

(54) MULTI-LEVEL OPERATION IN DUAL ELEMENT CELLS USING A SUPPLEMENTAL PROGRAMMING LEVEL

(75) Inventors: Darlene G. Hamilton, Husum, WA (US); Kulachet Tanpairoj, Stanford, WA (US); Fatima Bathul, Santa Clara, CA (US); Ou Li, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 179 days.

(21) Appl. No.: 11/771,961

(22) Filed: Jun. 29, 2007

(65) Prior Publication Data

US 2008/0158954 A1   Jul. 3, 2008

Related U.S. Application Data

(60) Provisional application No. 60/882,707, filed on Dec. 29, 2006.

(51) Int. Cl.
    *G11C 11/34* (2006.01)
(52) U.S. Cl. .............. 365/185.03; 365/185.24; 365/185.02; 365/189.06; 365/189.07
(58) Field of Classification Search ............ 365/185.03, 365/185.27, 185.29, 185.02, 185.24, 189.06, 365/189.07
    See application file for complete search history.

(56) References Cited

U.S. PATENT DOCUMENTS 7,113,431 B1 * 9/2006 Hamilton et al. ....... 365/185.29
2002/0163838 A1 * 11/2002 Guterman et al. ...... 365/185.28
2005/0153508 A1   7/2005 Lingunis et al.
2006/0152974 A1   7/2006 Bathul et al.
2007/0058455 A1 * 3/2007 Usami et al. .......... 365/189.07

OTHER PUBLICATIONS

International Search Report and Written Opinion for PCT Application No. PCT/US2007/085837, mailed Sep. 11, 2008, 80 pages.

* cited by examiner

*Primary Examiner*—Anh Phung
*Assistant Examiner*—Tha-O Bui
(74) *Attorney, Agent, or Firm*—Turocy & Watson, LLP

(57) ABSTRACT

The claimed subject matter provides systems and/or methods that facilitate programming and reading multi-level, multi-bit memory cells in a memory device. In multi-bit memory cells, programming one element can affect the second element. Certain combinations of elements can cause excessive levels of complementary bit disturb, state dependent non-uniform charge loss, and state dependent program disturb, reducing memory device reliability. Such effects may be pronounced where a high charge level is programmed into a first element while a second element of the same memory cell is unprogrammed. Memory cell elements can be programmed using additional charge levels to mitigate such effects. For example, the sixteen distinct element combinations possible using four charge levels can be mapped to a subset of twenty-five possible element combinations using five charge levels, avoiding element combinations likely to generate excessive complementary bit disturb, state dependent non-uniform charge loss, and state dependent program disturb.

20 Claims, 13 Drawing Sheets

US 7,652,919 B2

MULTI-LEVEL OPERATION IN DUAL ELEMENT CELLS USING A SUPPLEMENTAL PROGRAMMING LEVEL

CROSS-REFERENCE TO RELATED APPLICATIONS

This application claims the benefit of U.S. Provisional Patent Application Ser. No. 60/882,707 entitled "MULTI-LEVEL BIT OPERATION IN DUAL BIT CELLS USING A SUPPLEMENTAL PROGRAMMING LEVEL" filed on Dec. 29, 2006. The entirety of the above-noted application is incorporated by reference herein.

TECHNICAL FIELD

The present invention relates generally to memory devices and in particular to systems and methods of programming and reading memory cells or elements of a multi-level, multi-bit memory cell in nitride storage flash.

BACKGROUND

A wide variety of memory devices can be used to maintain and store data and instructions for various computers and similar systems. In particular, flash memory is a type of electronic memory media that can be rewritten and that can retain content without consumption of power. Unlike dynamic random access memory (DRAM) devices and static random memory (SRAM) devices in which a single byte can be erased, flash memory devices are typically erased and written in fixed multi-bit blocks or sectors. Flash memory technology evolved from electrically erasable and programmable read only memory (EEPROM) chip technology. Flash memory devices are less expensive and denser as compared to many other memory devices, meaning that flash memory devices can store more data per unit area.

Flash memory has become popular, at least in part, because it combines the advantages of the high density and low cost of EPROM with the electrical erasability of EEPROM. Flash memory is nonvolatile; it can be rewritten and can hold its content without power. It is used in many portable electronic products, such as cell phones, portable computers, voice recorders, thumbnail drives and the like, as well as in many larger electronic systems, such as cars, planes, industrial control systems, etc. The fact that flash memory can be rewritten as well as its retention of data without a power source, small size and light weight have all combined to make flash memory devices useful and popular means for transporting and maintaining data. As flash memory devices have continued to evolve, the density of data stored is increased. However, accuracy and reliability should be maintained.

A continuing trend in the electronics industry is to scale down electronic devices to produce, smaller, yet more powerful devices (e.g. cell phones, digital cameras, etc.) that can perform a greater number of increasingly complex functions faster and with less power. To achieve this, semiconductors and integrated circuits (e.g., memory cells, transistors, etc.) utilized in these devices are continually reduced in size. Techniques for reducing device size include packing more memory cells/transistors into a smaller area by forming their structures and component elements closer together and/or reducing component size. However, close proximity and/or size reduction of components (e.g., memory cells) can cause contamination, reducing reliability.

SUMMARY

The following presents a simplified summary of the innovation in order to provide a basic understanding of some aspects described herein. This summary is not an extensive overview of the claimed subject matter. It is intended to neither identify key or critical elements of the claimed subject matter nor delineate the scope of the subject innovation. Its sole purpose is to present some concepts of the claimed subject matter in a simplified form as a prelude to the more detailed description that is presented later.

The subject innovation relates to systems and/or methods that facilitate programming and/or reading multi-level, multi-bit nitride storage flash memory cells, where each side or element of a memory cell can be programmed to multiple target threshold voltage levels. For example, four distinct levels (e.g. L1, L2, L3 and L4) corresponding to varying amounts of charge can be stored in each element of a memory cell. The threshold voltage levels correspond to the level of charge stored in a memory cell element. Here, L1 is the lowest threshold voltage level or unprogrammed state and L4 indicates the highest amount of charge or highest threshold voltage level. A memory cell that maintains two elements, each with four possible levels of charge or threshold voltage levels can be programmed for sixteen distinct states or element pair combinations. However, programming one element or one side of a memory cell can disturb the other element or other side of the memory cell and shift its threshold voltage to a higher level. This disturb is referred to as complementary bit disturb and is most pronounced where a high charge level is maintained on a first element while a second element of the same memory cell is unprogrammed. The higher the programming threshold voltage of the first element, the higher the disturb will be on the second element.

The systems and methods described herein can provide for redefining levels of a multi-bit flash memory cell to mitigate complementary bit disturb, state dependent non-uniform charge loss, and state dependent program disturb. Data encoded using a set number of levels can be stored using a larger number of levels to avoid combinations likely to cause higher complementary bit disturb, state dependent non-uniform charge loss, and state dependent program disturb. For example, for data encoded using four levels as described above, five distinct levels corresponding to varying amounts of charge can be defined and utilized for each element of the memory cell. The addition of a new, fifth level of charge for a dual element memory cell results in twenty-five possible element pair combinations or memory cell states. A subset of the twenty-five possible combinations can be selected to represent the sixteen combinations or states achievable using four levels of charge. The remaining or unselected states are unused. Element pair combinations utilized to model the four-level combinations can be selected from the set of twenty-five possible combinations so as to minimize complementary bit disturb, state dependent non-uniform charge loss, and state dependent program disturb.

Combinations most likely to generate excessive levels of complementary bit disturb, state dependent non-uniform charge loss, or state dependent program disturb, referred to as potentially discordant combinations, can be identified and replaced utilizing new element pair combinations made available by addition of one or more levels. For example, new level (e.g. L5) can be greater in charge than the pre-existing levels. Potentially discordant combinations, such as combinations where a first element is unprogrammed and a second element has a high level of charge, can be represented by combinations utilizing the additional fifth level in place of the unprogrammed state. For instance, new level, L5, can be used to replace the unprogrammed state, L1, in potentially discordant combinations (e.g., L1-L4, L4-L1, L1-L3 and L3-L1), resulting in storing new combinations (e.g., L5-L4, L4-L5, L5-L3 and L3-L5), thereby alleviating complementary bit disturb, state dependent non-uniform charge loss, and state dependent program disturb.

Program and read operations can translate element pair combinations generated using a first set of levels to or from element pair combinations generated using a second, larger set of levels. For example, during program operation, element pair combinations utilizing four levels of charge can be translated to new element pair combinations utilizing five levels of charge prior to programming a memory cell or element(s). Element pair combinations that are not potentially discordant need not be replaced. Similarly, elements retrieved from memory cells can be translated from five level combinations to corresponding four level combinations. In this manner, five levels of charge can be utilized to model or simulate four levels, while mitigating complementary bit disturb, state dependent non-uniform charge loss, and state dependent program disturb.

The following description and the annexed drawings set forth in detail certain illustrative aspects of the claimed subject matter. These aspects are indicative, however, of but a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

DETAILED DESCRIPTION

Figure 1:
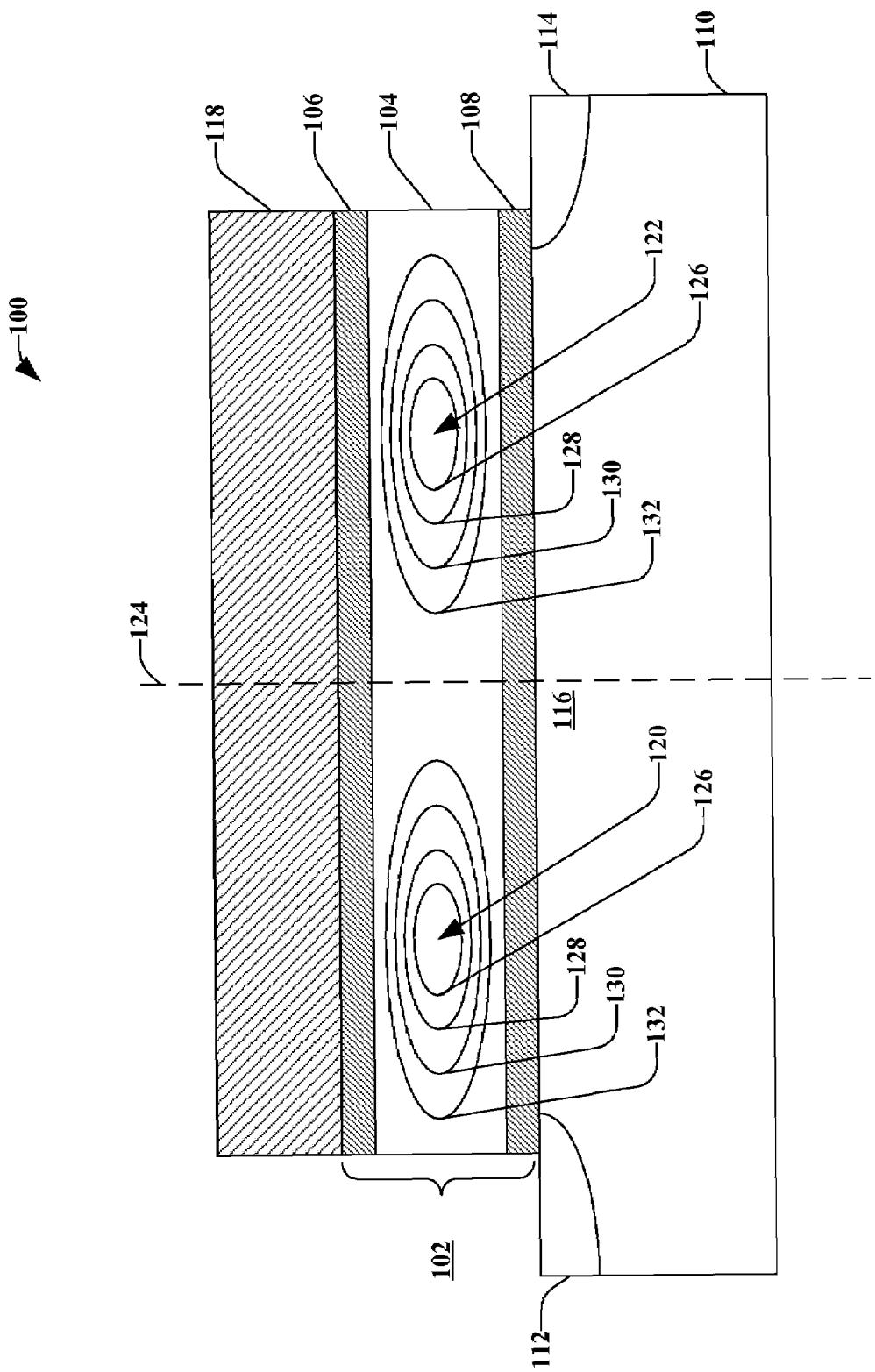
FIG. 1 illustrates a side cross-sectional view of an exemplary dual element nitride storage flash memory cell in accordance with an aspect of the subject matter disclosed herein.

The claimed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the claimed subject matter may be practiced without these specific details. In other instances, well-known structures and devices are shown in block diagram form in order to facilitate describing the subject innovation.

The word "exemplary" is used herein to mean serving as an example, instance, or illustration. Any aspect or design described herein as "exemplary" is not necessarily to be construed as preferred or advantageous over other aspects or designs.

Flash memory is typically constructed of many memory cells where, generally, one or more binary bits of data are stored in and read from respective memory cells. In operation, individual flash memory cells are addressed via the respective bitline and wordline employing peripheral decoder and control circuitry for programming (writing), reading and erasing the cell.

A flash memory cell is programmed by applying high voltage on control gate and appropriate voltages on source, and drain. Generally the drain voltage or potential is predetermined to be above the source. When a resulting electric field is high enough, electrons collect enough energy to be injected from source onto floating gate in the case of floating gate flash memory or onto nitride layer of dual element cell by a mechanism called hot-electron injection or hot-carrier injection. As a result of the trapped electrons, the threshold voltage of the cell increases. This change in the threshold voltage (Vt) (and thereby the channel conductance) of the cell created by the trapped electrons causes the cell to be programmed.

More recently, nitride storage flash memory has been introduced, which allows multiple elements to be stored in a single memory cell. In particular, in a dual element memory device (e.g., dual element ONO flash memory), one side of a dual element memory cell is called a complementary element (CB) and the other side of the dual element memory cell is called a normal element (NB). The dual element memory cell uses the nitride layer to store charge. For example, a layer of nitride in an ONO (oxide-nitride-oxide) stack can be used to store charge; and since nitride is not a conductor, the charge added or removed during the program and erase operations should not redistribute to other regions of the layer of nitride. However, the buildup of charge in one element does affect the other element, changing the reading, programming and erase characteristics of the cell in subsequent cycles. Eventually, the buildup of residual charge can change the effective threshold voltage (Vt) of memory cell elements, CB and the NB.

The threshold voltage of a memory cell element is the voltage at which a conductive path is formed between a source and a drain. Briefly, when charge is stored within an element, the threshold voltage increases. Accordingly, programmed elements (stored levels of charge) and unprogrammed elements (without charge) can be distinguished based upon their respective voltage thresholds and resulting conduction characteristics. Voltage thresholds are discussed in further detail below with respect to multiple levels.

In the case of a multi-bit cell, a memory cell is essentially split into two mirrored or complementary regions, each of which is formulated for storing one of two independent data elements or charge. Each dual element flash memory cell has a gate, a source and a drain. However, unlike a traditional NOR type floating gate cell in which the source is always connected to an electrical source and the drain is always connected to an electrical drain, dual element flash nitride storage NROM memory cells can reverse the connections of the source and drain during operation to permit the storing of two independent data elements (CB and NB).

However, proximity of charges in such dual element flash architectures can cause certain undesirable phenomena, namely complementary bit disturb. The charge on the elements can disturb each other, causing operations performed on the elements to be more challenging and introducing a greater opportunity for error.

The storage layer (e.g. an ONO layer) also allows the independent elements to be stored at multiple states or levels of charge. For example, during programming, varying amounts of charge can be stored at an element. Different amounts of charge can correspond to multiple data storage. For example, if each element is capable of storing four different charge levels (e.g., 1, 2, 3 and 4), then each dual-element memory cell can support sixteen different states defined by sixteen combinations or pairs of elements (e.g., 1-1, 1-2, 1-3, 1-4; 2-1, 2-2, 2-3, 2-4; 3-1, 3-2, 3-3, 3-4; and 4-1, 4-2, 4-3, 4-4).

Certain element pair combinations can result in excessive levels of complementary bit disturb, state dependent non-uniform charge loss, and state dependent program disturb. Such combinations are referred to herein as potentially discordant combinations. Typically, the combination of an unprogrammed element and an element holding a high level charge (e.g., level 3 or level 4) in a dual-element memory cell results in decreased performance and data retention. As discussed in detail below, certain combinations (e.g., 1-3, 3-1, 1-4 and 4-1) are particularly problematic.

To avoid potentially discordant combinations, data encoded using a set of levels (e.g., 1, 2, 3 and 4) can be adapted or mapped to a larger set of levels (e.g., 1, 2, 3, 4 and 5). Use of a larger set of levels provides a larger set of possible element pair combinations. Element pairs based upon the original set of levels can be mapped to the larger set of element pair combinations while avoiding potentially discordant combinations. For example, for data encoded using four levels, an additional, fifth level can be added. The resulting twenty-five possible combinations can be utilized to model the original sixteen possible combinations, while avoiding the problematic combinations (e.g., 1-3, 3-1, 1-4 and 4-1). The unprogrammed state, level one, can be replaced with a new highest level, level five, when level one is to be used in combination with high charge levels, levels three or four. This substitution allows the memory cell to support sixteen possible states, but circumvents storage of a high-level charge and an unprogrammed element within the same memory cell.

Now turning to the figures, FIG. 1 depicts an exemplary dual element memory cell 100 (e.g. a dual element ONO memory cell) illustrating the capability of the cell 100 to store varying degrees of charge at each element location. The memory cell 100 can include a set of layers 102 that maintain charge including charge-trapping layer 104 (e.g., silicon nitride) sandwiched between a top layer 106 (e.g., silicon dioxide) and a bottom layer 108 (e.g., silicon dioxide). Due to its layer-to-layer configuration, the set of layers 102 is frequently referred to as an ONO layer (oxide, nitride, oxide layers). The charge-trapping layer 104 is formed from one or more substantially non-conductive substances, such as nitride based materials. The top and bottom layers 106, 108 are similarly formed from one or more electrically insulating substances, such as oxide based materials.

The set of layers 102 is formed over a substrate 110 that can be formed from silicon or some other semiconductor material, for example. The substrate 110 can be selectively doped with a p-type dopant (e.g. boron) to alter its electrical properties. In the illustrated example, the substrate 110 can include buried bitlines or bitline diffusions 112, 114. Bitline diffusions can be formed by an implanted n-type dopant, and may correspond to bitlines. The bitline diffusions 112, 114 can define a channel 116 within the substrate 110.

Overlaying the top layer 106 is a control gate 118. The gate can be formed from a polysilicon material and can be doped with an n-type impurity (e.g., phosphorus) to alter its electrical behavior. The gate 118 can provide a wordline connection to the memory cell 100. The gate 118 enables a voltage to be applied to the cell 100 such that separate electrical charges can be stored at element locations 120 and 122, depending upon the electrical connections of the bitline diffusions 112, 114. Element location 122 is referred to herein as the right element of memory cell 100 and element location 120 is referred to as the left element.

The dual element flash memory cell 100 is generally symmetrical, with respect to axis line 124. Axis line 124 is illustrative of the generally symmetrical form of the memory cell 100 and does not represent a component of the memory cell 100. The cell 100 can be programmed by applying a voltage across an acting drain region and the gate 118 and connecting an acting source region to ground. Here, bitline diffusions 112 and 114 can act interchangeably as a source and a drain. Selection of the source and drain controls the element location to be programmed. The left bitline diffusion 112 serves as the source and the right bitline diffusion 114 as the drain for programming the right element location 122. Conversely, the right bitline diffusion 112 can serve as the drain and the left bitline diffusion 114 as the source to program the left element location 120.

During programming of the cell 100 voltages are applied to the acting drain region and the gate 118 and while the acting source region is grounded. The acting drain region is typically biased to a potential above the acting source. As a result of the gate bias, a high electric field is applied across the charge trapping layer 104. Due to a phenomenon know as "hot electron injection," electrons can pass from the acting source region through the bottom layer 108 and become trapped in the charge-trapping layer 104 at element locations 120 and 122.

Left and right element locations 120, 122 can be selectively programmed based upon selection of the left and right bitlines 112, 114 as acting drain and acting source. The left element location 120 can be programmed by applying a program voltage to the gate 118 and a drain voltage to the left bitline 112, which is acting as the drain region during programming of the left element location 120. The right bitline 114, which acts as a source region during programming the left element location 120, can be connected to ground, or biased to a different voltage level. The applied voltages generate a vertical electric field through the top and bottom layers 106, 108 and the charge-trapping layer 104, and generate a lateral electric field across a length of the channel 116 from the right bitline 112 to the left bitline 114. At a given voltage, the channel 116 inverts such that electrons are drawn off the acting source (the right bitline 114) and begin accelerating towards the acting drain (the left bitline 112).

As the electrons move along the length of the channel 116, the electrons gain energy and, upon attaining enough energy, the electrons jump over the potential barrier of the bottom layer 108 and into the charge-trapping layer 104, where the electrons become trapped. Electrons are most likely to jump the potential barrier adjacent to the acting drain, where the electrons have gained the greatest energy. These accelerated electrons are known as "hot electrons." Since the charge-trapping layer (e.g., silicon nitride) is non-conducting, a first charge can be injected into the charge-trapping layer 104 near the first bitline diffusion 112 and a second charge can be injected into the charge-trapping layer 104 near the second bitline diffusion 114. Therefore, two elements per cell can be maintained within a single memory cell 100. The program operation for the right element location is similar, with the right bitline 114 acting as a drain region and the left bitline 112 acting as the source region.

If the voltages utilized to program the left and right element locations 120, 122 of the cell 100 are increased or sustained for longer periods of time, the number of electrons or amount of charge stored at these locations 120, 122 can be increased or otherwise varied. This allows the memory cell 100 to be utilized for additional data storage. For example, different amounts of charge can correspond to different programmed levels or states.

For read operation, a voltage bias is applied across an acting drain to an acting source of the cell 100. A voltage is then applied to the gate 118 of the memory cell 100 to cause a current to flow from the acting drain to the acting source. The resulting current is measured, by which a determination is made as to the value of the data stored in an element location 120, 122 of the cell 100. For example, in a single level memory cell, if the current is above a certain threshold voltage value, the element is deemed unprogrammed, whereas if the current is below a certain threshold voltage value, the element is deemed to be programmed. For a multi-level memory element/cell 100, measured currents and/or threshold voltages that fall within first, second, third, fourth and fifth ranges can represent level 1, level 2, level 3, level 4 or level 5 respectively for a stored element. A second element can be read by reversing operations of the first and second bitline diffusions 112, 114 for the acting drain and acting source.

Program and erasure of one element in a cell 100 effects programming, reading and/or erasure of its associated element. For example, repeated programming of left element location 120 of cell 100 can cause charge accumulation in right element location 122 and vice versa. Also, repeated application of erase voltage pulses to left element location 120 can cause over erasure of right element location 122. These phenomena can in turn result in degradation with respect to operation of the elements during normal operation (e.g., the ability to effectively read, write/program, and/or erase one or both elements).

Complementary bit disturb, state dependent non-uniform charge loss, and state dependent program disturb can be reduced by eliminating potentially discordant combinations. To avoid potentially discordant combinations, data encoded using a first set of levels (e.g., 1, 2, 3 and 4) can be adapted or mapped to a larger set of levels (e.g., 1, 2, 3, 4 and 5) prior to programming of the memory cell. Use of a larger set of levels provides an increased set of possible element pair combinations. Element pairs based upon the original set of levels can be mapped to the larger set of element pair combinations, avoiding utilizing potentially discordant combinations. For example, for data encoded using four levels, an additional, fifth level can be added.

In the exemplary memory cell 100 illustrated in FIG. 1, for instance, complementary bit disturb, state dependent non-uniform charge loss, and state dependent program disturb can be mitigated using five charge levels to model the sixteen possible memory cell states achievable using four charge levels. Here, both the left and right element locations 120, 122 can have five possible distinct charge levels, namely level 1, level 2, level 3, level 4 and level 5, where level 1 (L1) corresponds to an unprogrammed state, and levels 2, 3, 4 and 5 (L2, L3, L4 and L5, respectively) correspond to increased amounts of stored charge, respectively. For example, a level 2 may correspond to a relatively small stored charge 126, while levels 3, 4 and 5 may correspond to increasingly larger amounts of stored charge 128, 130 and 132, respectively.

The five levels illustrated can be used to simulate the sixteen pattern combinations typically achieved with four levels of charge. It is possible to form twenty-five separate combinations utilizing five levels of charge in a dual element memory cell. However, by selectively utilizing a fifth, higher level of charge in place of an unprogrammed state, sixteen combinations can be realized while avoiding potentially discordant combinations within a memory cell.

Figure 2:
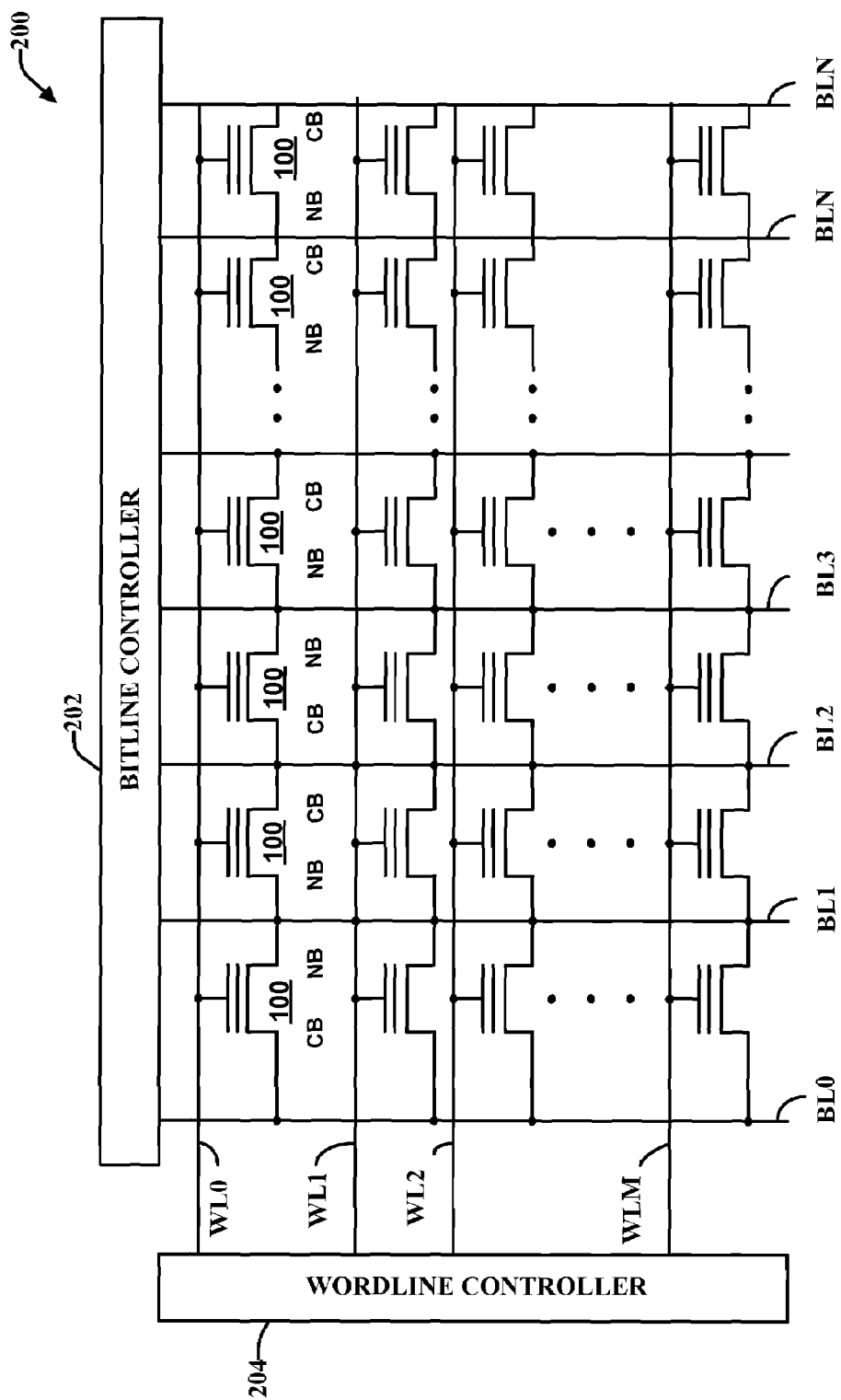
FIG. 2 illustrates a schematic illustration of a portion of a wordline of dual element nitride storage flash memory cells in accordance with an aspect of the subject matter disclosed herein.

FIG. 2 illustrates a system 200 for programming and/or reading a portion of a sector of cells in accordance with an aspect of the present invention. A sector is an array of dual element memory cells, such as cells 100 illustrated in FIG. 1. Each cell includes a complementary element (CB) and normal element (NB). The system 200 includes a bitline controller 202 and a wordline controller 204 that decode I/Os during various operations that are performed on the sector (e.g., programming, reading, verifying, erasing). The bitline controller 202 and wordline controller 204 receive address bus information from a system controller (not shown) or the like. Dual element cells 100 are formed in M rows and N columns. A common wordline is attached to the gate of each cell in a row, such as wordlines WL0, WL1, WL2, through WLM. A common bitline is attached to each cell 100 in a column, such as bitlines, BL0, BL1, through BLN. A wordline can contain, for example, 1000 elements forming multiple words and a sector can include, for example, 512 wordlines to provide 512K elements of memory. Voltages are applied to one or more cells 100 through the wordlines and bitlines to perform operations, such as program, read and the like.

Figure 3:
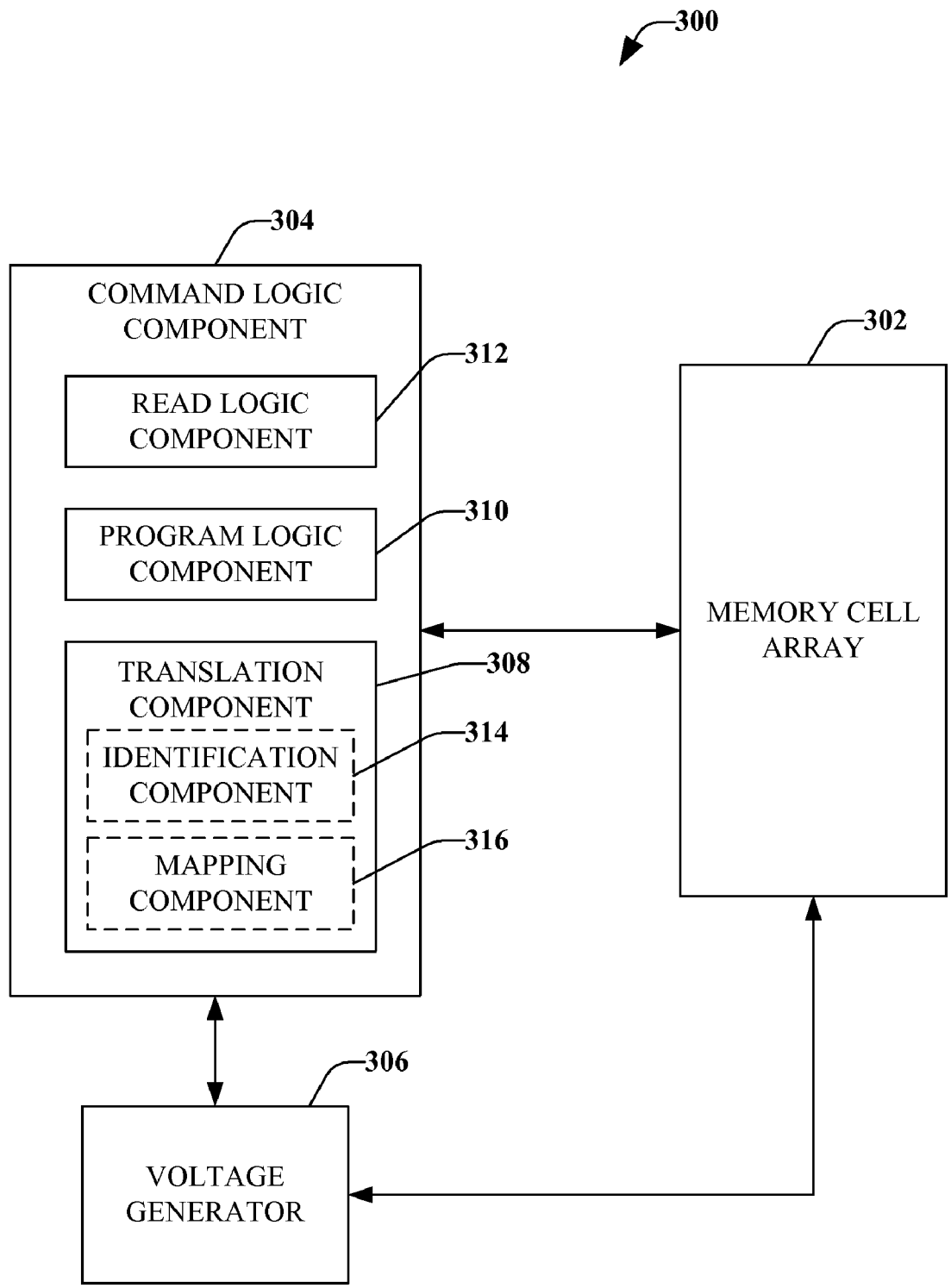
FIG. 3 illustrates a block diagram of a system for managing a multi-level, multi-bit nitride storage flash memory cell array in accordance with an aspect of the subject matter disclosed herein.

Referring now to FIG. 3, a system 300 for programming and/or reading an array of multi-level, dual element memory cells 302 is illustrated. The memory cell array 302 can include a plurality of sectors, where a sector is a portion of an array that shares a sector address. A command logic component 304 receives commands or instructions from a system control (not shown) or the like. The instructions invoke programming and/or reading of memory cells of the memory cell array 302. A voltage generator component 306 can also be connected to the memory cell array 302 and command logic component 304. The voltage generator component 306 is operable to generate necessary voltages for programming and/or reading memory cells of the memory array 302 and can be controlled by the command logic component 304.

The command logic component 304 can include a translation component 308 that adapts or translates data to mitigate complementary bit disturb, state dependent non-uniform charge loss, and state dependent program disturb by avoiding potentially discordant element pair combinations within a memory cell. The translation component 308 can be used in conjunction with a program logic component 310 and a read logic component 312 to modify data prior to programming of memory cells and to restore the original data upon retrieval from memory cells. In particular, the translation component 308 can map element pairs encoded or generated using a first set of levels, referred to herein as data levels, to a second set of levels, referred to herein as storage or program levels, where the number of program levels is greater than the number of data levels. For example, element pairs based upon four charge levels can be encoded using five charge levels for storage in a memory cell illustrated in FIG. 1. Utilizing an additional level or levels provides extra element pair combinations. These supplementary element pair combinations can be used to replace potentially discordant combinations, thereby reducing complementary bit disturb, state dependent non-uniform charge loss, and state dependent program disturb.

The translation component 308 can utilize or include a look-up or translation table to map the data element pairs to the new levels. Alternatively, the translation component 308 can include an identification component 314 capable of identifying potentially discordant element pair combinations and a mapping component 316 that maps identified potentially discordant combinations to new element pair combinations. Once translated, a memory cell within the memory cell array 302 can be programmed with the translated element pair values.

The read logic component 312 can read element values from memory cells within the memory cell array 302. The retrieved values will be encoded using the storage levels. Accordingly, the values should be mapped to the original data levels before being provided to system control. The translation component 308 can map the retrieved element values to data levels. The translation component 308 can include a translation table.

Figure 4:
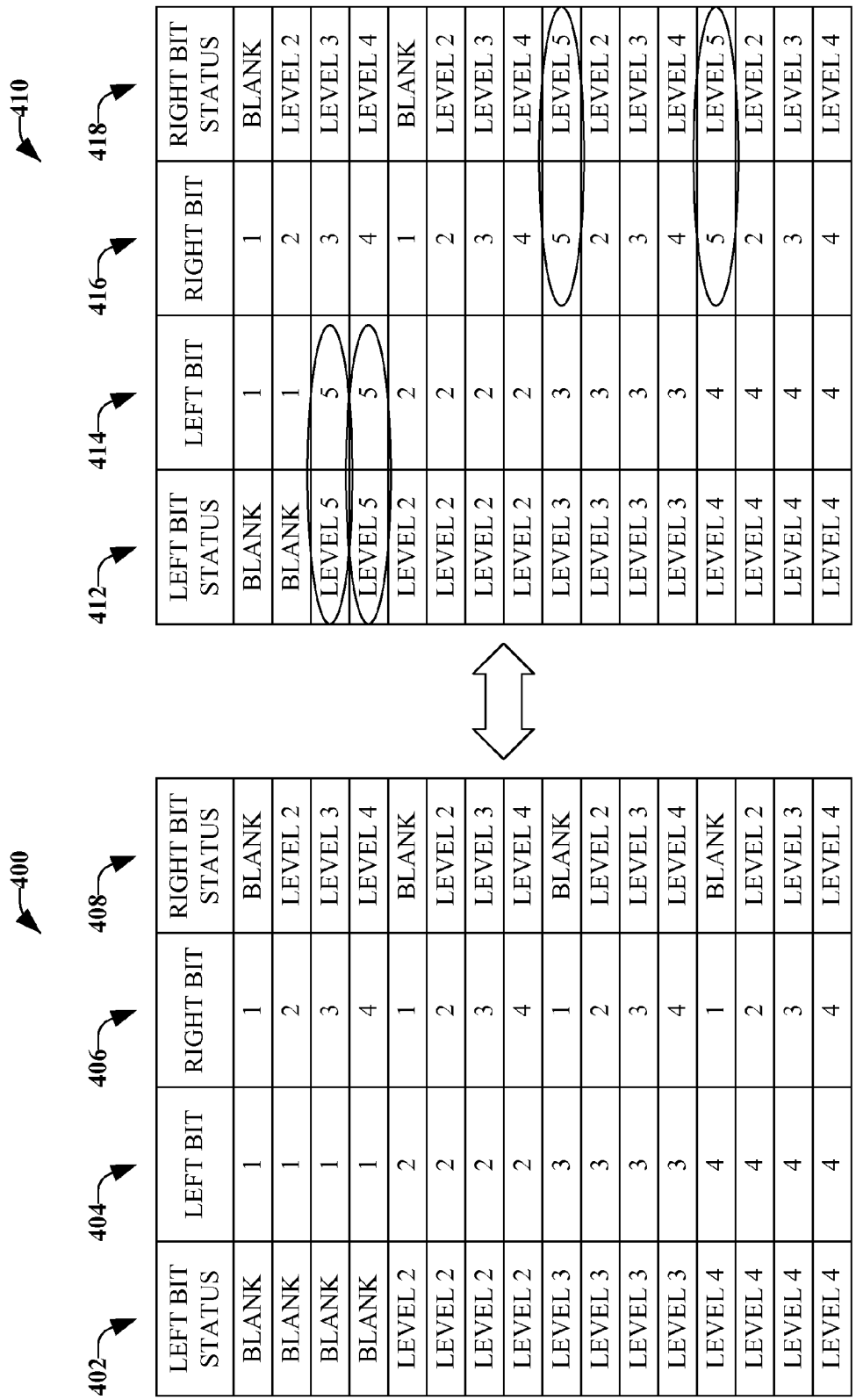
FIG. 4 illustrates possible patterns of element combinations for dual element flash memory cells in accordance with an aspect of the subject matter disclosed herein.

Referring now to FIG. 4, possible states or element pair combinations for a dual element flash memory cell are illustrated. A first pattern 400 depicts states generated or encoded utilizing four separate program/charge levels. The first column 402 indicates the status (e.g. blank, level 2, level 3 and level 4) for the left element. The second column 404 indicates the left element value that corresponds to the status (e.g., 1, 2, 3 and 4). The third column 406 indicates the right element value that corresponds to right element status as shown in the fourth column 408. The pattern 400 includes all sixteen possible element pairs or memory cell states resulting from combining possible left and right element values.

A second pattern 410 utilizes five separate levels (e.g., 1, 2, 3, 4 and 5) to model the sixteen element pair combinations or states illustrated in the first pattern 400. The first column 412 indicates the status (e.g., blank, level 2, level 3, level 4 and level 5) of the left element. The second column 414 indicates the left element value (e.g., 1, 2, 3, 4 and 5) that corresponds to the status. The third column 416 indicates the right element value (e.g., 1, 2, 3, 4 and 5) that corresponds to right element status (e.g., blank, level 2, level 3, level 4 and level 5) as shown in the fourth column 418. Here, the additional fifth level has been used to avoid potentially discordant element pair combinations. Although, it is possible to generate twenty-five combinations utilizing five levels, a number of possible combinations are unused (e.g., 1-5, 5-1, 5-2 and 2-5). More particularly, the unprogrammed elements in potentially discordant combinations (e.g., 1-4, 4-1, 1-3 and 3-1) have been replaced by a high level 5 charge (e.g., 5-4, 4-5, 5-3 and 3-5). Instances of the fifth level are circled for emphasis in the illustrated pattern 410.

In the five level pattern 410 illustrated in FIG. 4, the new higher level of charge or higher threshold voltage programmed element (e.g., level 5) need only be substituted for the unprogrammed or blank state where the unprogrammed state is combined with a higher level charge or higher threshold voltage programmed element within a memory cell. When the unprogrammed state is combined with a relatively low level charge or lower threshold voltage element in dual element memory, complementary bit disturb, state dependent non-uniform charge loss, and state dependent program disturb may be minimal. In fact, the combination of the new higher level with a low level charge or threshold voltage may be more disruptive, than the combination of the unprogrammed state and a low level charge or voltage threshold. The patterns illustrated in FIG. 4, are merely exemplary. Additional patterns can be utilized, while still avoiding potentially discordant combinations.

Figure 5:
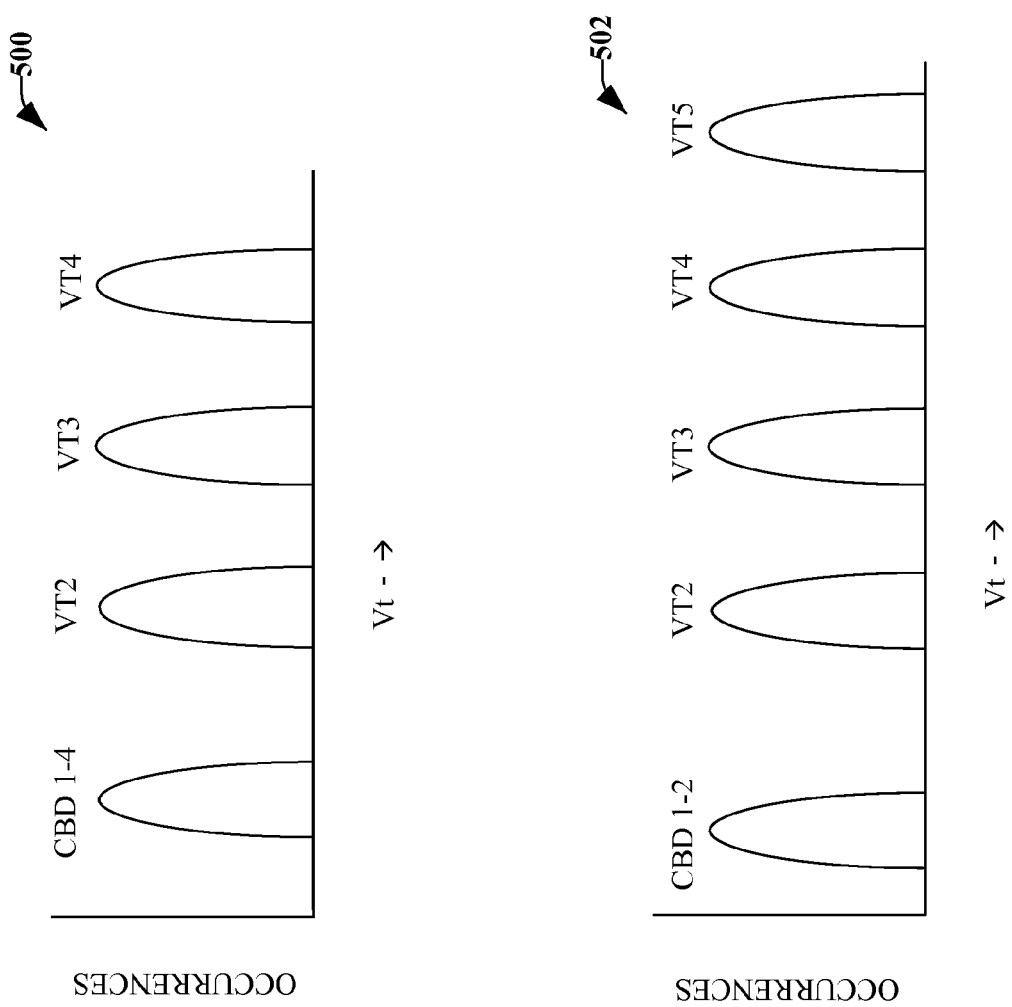
FIG. 5 illustrates threshold voltage distributions for multi-level, multi-bit dual element cells in accordance with an aspect of the subject matter disclosed herein.

Turning now to FIG. 5, a first graph 500 depicts a distribution of memory cell elements utilizing four levels or states. A set of memory cells elements (e.g., a million elements) are programmed to one of four levels, corresponding to four threshold voltages (e.g., blank or unprogrammed, Vt2, Vt3 and Vt4). The curves on graph 500 represent population of elements or spread of actual threshold voltage values corresponding to the different voltage thresholds, Vt2, Vt3 and Vt4. For example, the VT2 curve represents actual voltage thresholds for elements set to level 2 for all element pair combinations in which an element is set to level 2 (e.g., 2-1, 2-2, 2-3 and 2-4). In addition, complementary bit disturb (CBD) is illustrated in the distribution 500. Here, the largest CBD is generated when one element of a memory cell is unprogrammed, level 1, and the other side is at the highest Vt level, level 4. Even though the level 1 side is unprogrammed, the high level of charge or Vt from the level 4 element will cause a shift in the unprogrammed element.

The greatest levels of complementary bit disturb (e.g., CBD at 1-4), should be lower than the lowest possible level 2 threshold voltage (VT2) to avoid errors in reading data from memory cells. Similarly, the highest programmed voltage level for VT2 should be lower than the lowest programmed voltage level for VT3 and the highest programmed voltage level for VT3 should be lower than the lowest programmed voltage level for VT4. If the programmed voltage thresholds are not clearly distinguishable, element levels read from memory cells may be erroneous.

A second graph 502 depicts a distribution of memory cell elements utilizing five levels or states to model the sixteen memory cell states achievable using four levels of charge. As in the first graph 500, a set of memory cells elements (e.g., a million elements) are programmed. However, the elements are now programmed to one of five levels or one of five threshold voltages (e.g., blank or unprogrammed, Vt2, Vt3, Vt4 and Vt5). The curves on graph 500 represent the population of elements or spread of actual threshold voltage values corresponding to the different voltage thresholds, VT2, VT3, VT4 and VT5.

The memory cell elements that populate the second graph 502 can be programmed using the five level pattern illustrated in FIG. 4. Certain potentially discordant combinations (e.g., 1-4, 4-1, 1-3 and 3-1) are modified by substituting level 5 for the unprogrammed level 1. After substitution, the VT2 curve represents actual voltage thresholds for elements set to level 2 for all possible combinations, where at least one element is set to level 2 (e.g., 2-1, 2-2, 2-3 and 2-4). Similarly, the VT3 curve represents actual voltage thresholds for elements set to level 3 for all possible combinations. However, level 3 is no longer combined with the unprogrammed state. For example, possible combinations can include level 3, 4 and 5 (e.g., 3-2, 3-3, 3-4 and 3-5). Similarly, the VT4 curve represents actual voltage thresholds for level four combinations without utilizing an unprogrammed or blank element (e.g., 4-2, 4-3, 4-4 and 4-5) and a new VT5 curve represents actual voltage thresholds for a limited set of level 5 combinations (e.g., 5-3 and 5-4). As shown in graph 502, the highest level of CBD will be generated when one element of a memory cell is unprogrammed, level 1, and the other side programmed to level 2.

As can be seen from graphs 500 and 502, distributions utilizing five levels may utilize a wider window or separation between highest CBD level and lowest VT2 level than four-level distributions. This enlarged window facilitates distinguishing between the different voltage thresholds.

Figure 6:
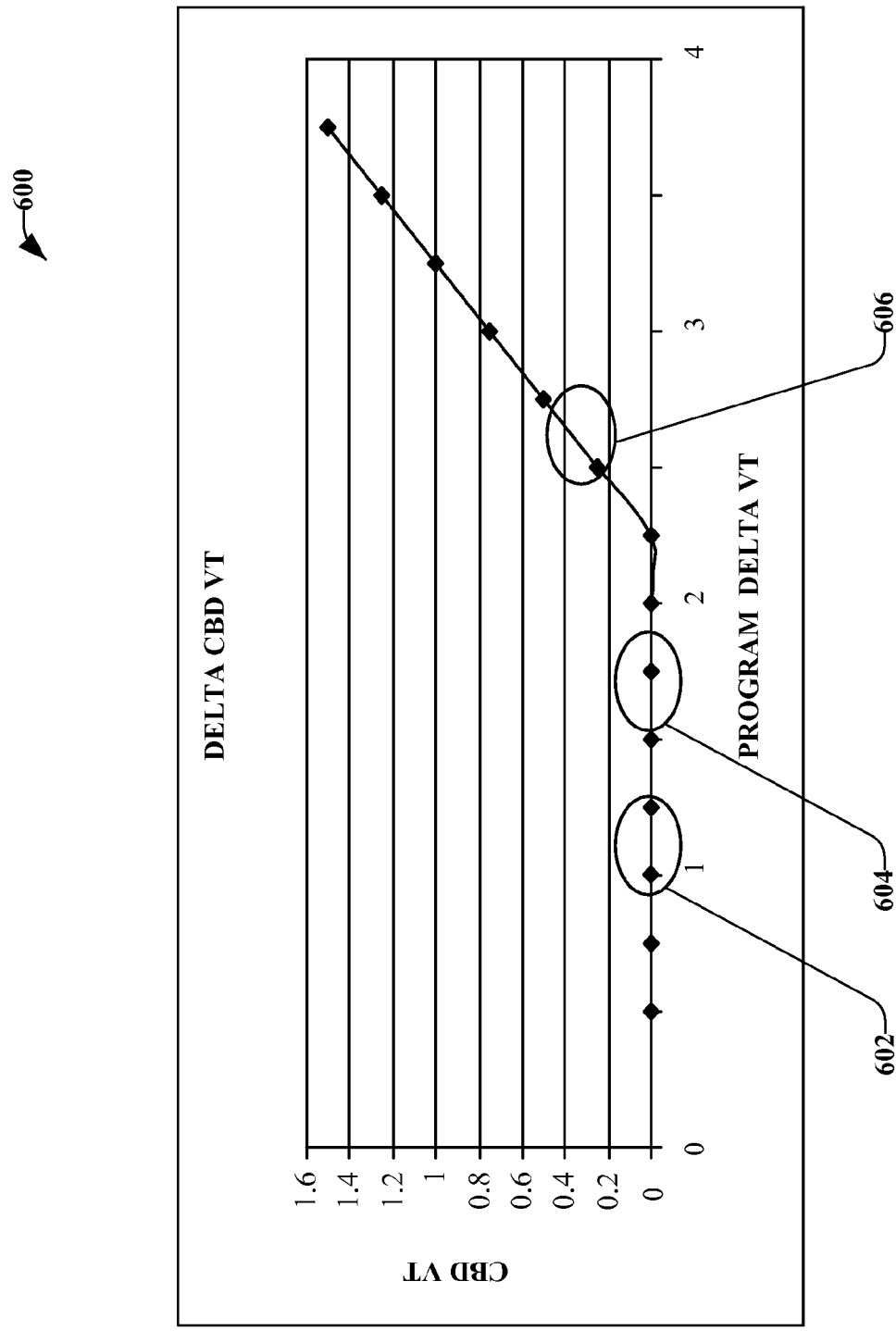
FIG. 6 illustrates complementary bit disturb levels for various element pair combinations.

FIG. 6 is a graph 600 depicting complementary bit disturb for element pairs where one element of the memory cell is unprogrammed or blank. Generally, complementary bit disturb is most pronounced when one element of a memory cell is unprogrammed and the other element is programmed with a high charge level or voltage threshold. The graph 600 shows increases in complementary bit disturb (CBD) as the difference in charge levels or voltage thresholds of the element increases. Here, the horizontal axis represents program delta VT equal to the difference in charge between the threshold voltage for a programmed element (e.g., 2, 3 or 4) and the threshold voltage of the unprogrammed element (e.g., 1). The vertical axis represents the complementary bit disturb (CBD) in volts. A first delta VT region 602 shows CBD where the unprogrammed state is combined with a level 2 charge (e.g., 1-2, 2-1); second delta VT region 604 depicts CBD where the unprogrammed state is combined with a level 3 charge (e.g., 1-3, 3-1) and a third delta VT region 606 depicts CBD where the unprogrammed state is combined with a level 4 charge (e.g., 1-4, 4-1). As shown in Graph 600, complementary bit disturb increases dramatically after approximately 2.2 Volts delta VT. Clearly, high charge level or threshold voltage and blank or unprogrammed combinations (e.g., 1-3, 3-1, 1-4 and 4-1) can lead to excessive complementary bit disturb.

Figure 7:
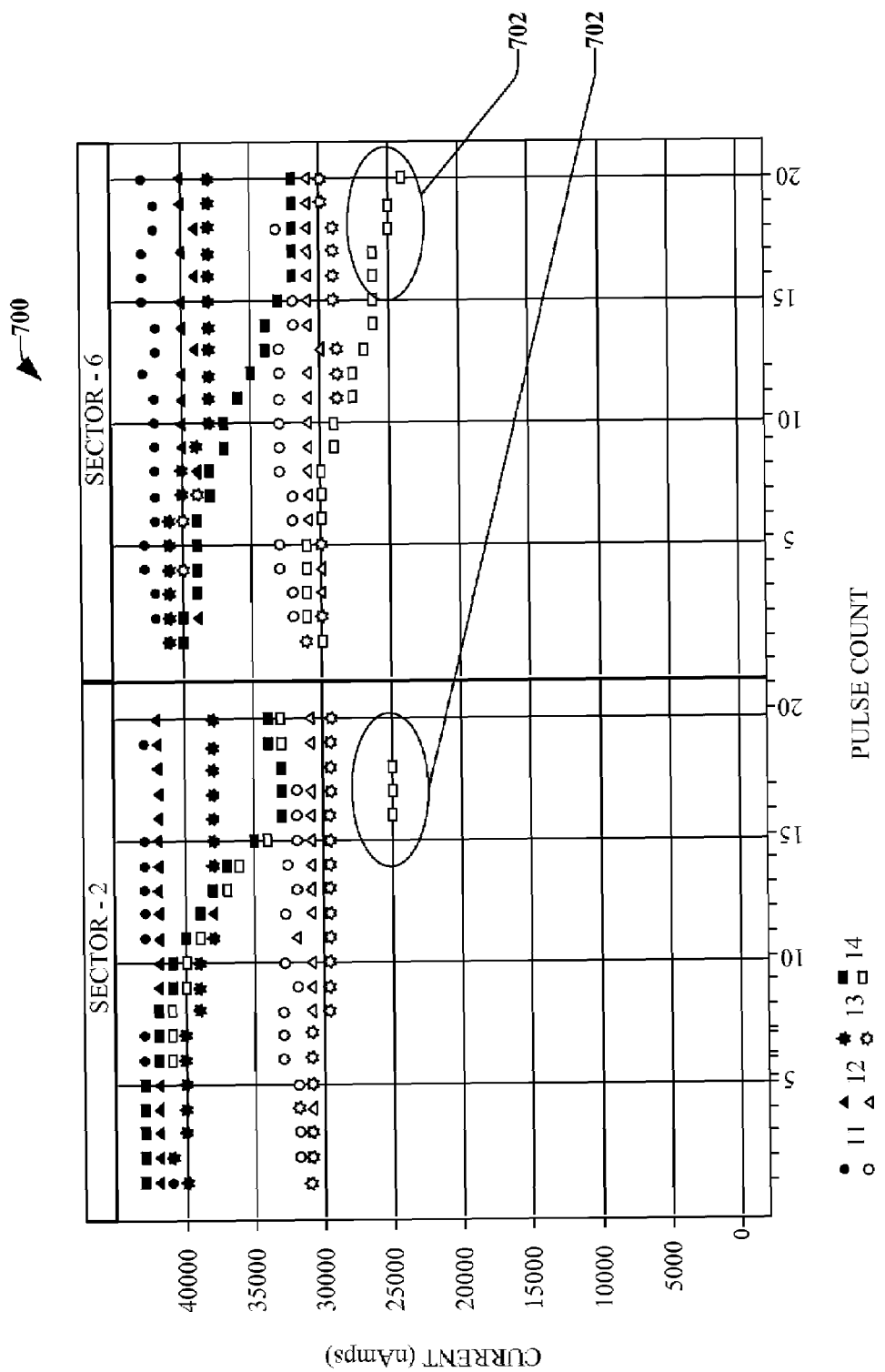
FIG. 7 illustrates effects of complementary bit disturb in terms of current for various element pair combinations.

Referring now to FIG. 7, a graph 700 depicting effects of complementary bit disturb upon current is illustrated. The graph 700 shows element pair combinations utilizing four levels of charge including the unprogrammed state (e.g., 1-1, 1-2, 1-3 and 1-4). Typically, memory cell elements are programmed using multiple application or pulses of charge. Here, current for element pair combinations combining an unprogrammed element (e.g., 1) with a programmed element (e.g., 2, 3 and 4) are plotted with respect to pulse count for selected sectors of a memory cell array. The horizontal axis of the graph 700 represents the number of pulses for two exemplary sectors and the vertical axis represents current in Nano-Amperes.

Certain element pair combinations are likely to lose current or gain charge on the blank or unprogrammed element during programming of the other element in a dual element memory cell. Typically, a series of program pulses are used to program an element. Over the course of twenty program pulses, current remains relatively constant for the blank or unprogrammed side for element pair combinations of a low-level threshold voltage element on one side and a blank element on the other side (e.g., 1-2). However, element pair combinations including a blank element and a programmed element with a higher threshold voltage level (e.g., level 4) show a tendency to gain more charge on the blank side element (e.g. 1-4) over the course of programming pulses. These potentially problematic element pair combinations demonstrating reduced current 702 are indicated on the graph 700.

Figure 8:
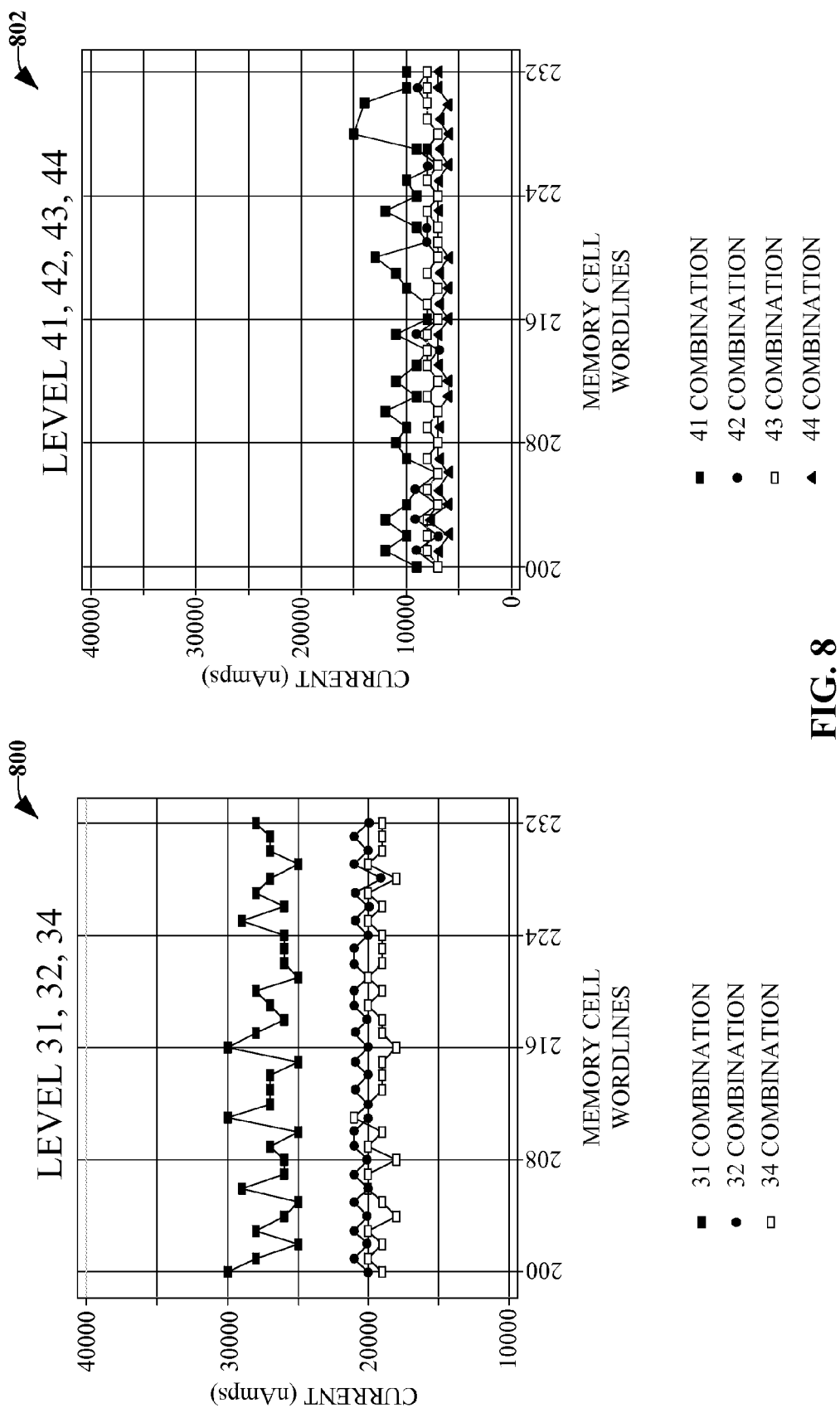
FIG. 8 illustrates program disturb for various element pair combinations after program stress test and disturb.

Turning now to FIG. 8, graphs 800, 802 describe program disturb for various element pair combinations. Program disturb occurs when programmed elements are unintentionally stressed resulting in deprogram. Graphs 800, 802 depict current after 1000 milliseconds of stress. Here, the vertical axis represents current, while the horizontal axis represents row lines of memory cells. Each point indicates current level for a memory cell maintaining a specific element pair combination.

Three lines on the first graph 800 represent current values for element pair combinations including a level 3 charge (e.g., 3-1, 3-2, 3-4). The graph 800 clearly shows the increase in current due to disturb after stress where a relatively high-level charge element and an unprogrammed element are combined (e.g., 3-1). Lines representing current for combinations of lower level elements and a high level programmed elements (e.g., 3-4, 3-2) remain in programmed charge or current level without disturb after the same stress period. A second graph 802 includes lines representing current values for element pair combinations including a level four charge (e.g., 41, 42, 43 and 44). The second graph 802 also shows an increase in current due to disturb after the stress when combining a high-level charge element and an unprogrammed element (e.g., 4-1).

Generally, increases in current correspond to charge loss due to increasing stress on a programmed element. However, increased current due to this program disturb can be alleviated by avoiding potentially discordant combinations (e.g., 31, 41) by utilizing additional levels. Limiting this form of program disturb can also allow for use of larger memory cell sectors, thereby lowering memory costs. In addition, limiting such program disturb can improve performance by facilitating partial sector erase.

Figure 9:
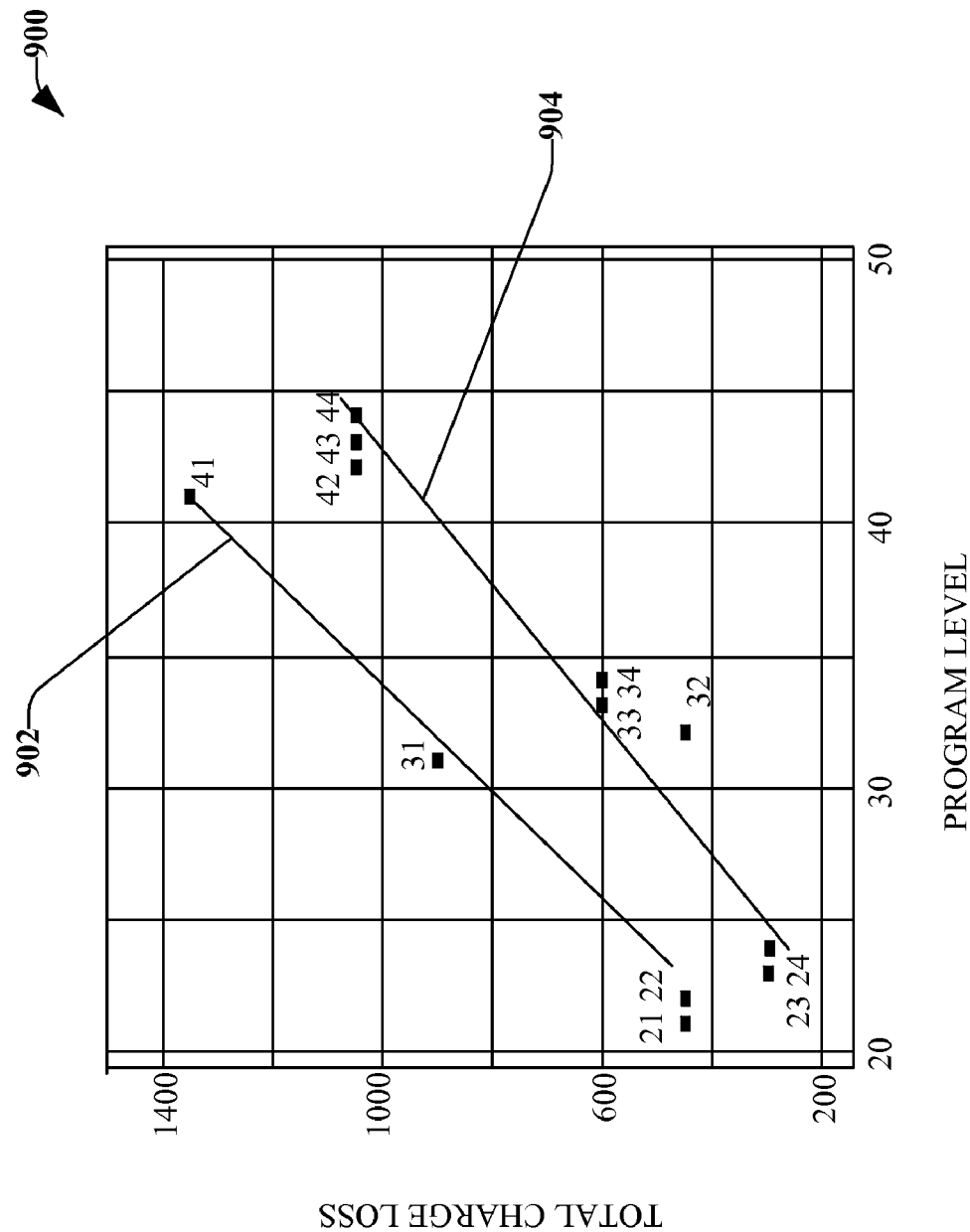
FIG. 9 illustrates element pair charge loss with respect to various element pair combinations.

Referring to FIG. 9, differences in element pair charge loss are illustrated. A graph 900 plots charge loss based upon after repeated program and erase (P/E) cycles, more particularly, charge loss after one hundred or more cycles. Typically, memory cells within a memory device will be repeatedly programmed and erased. After many such P/E cycles, the memory array becomes stressed. Cells within the memory array may degrade at an increased rate due to stress aging. Eventually, the decay rate of charge within memory cells increases and the cells lose charge so quickly that the cells may suddenly change data state, resulting in loss of data. Prevention of stress and reduction of charge loss can improve data retention and memory cell reliability.

Graph 900 depicts charge loss for various element pair combinations. Here, the vertical axis represents the total charge loss in millivolts and the horizontal axis represents the element pair combinations (e.g., 2-1, 3-1, 4-1 and 4-4). A first line 902 indicates charge loss where one side of the memory cell is unprogrammed. The second line 904 represents charge loss where both sides of the memory cell are programmed. In general, charge loss where one side of the memory cell is unprogrammed (e.g., 2-1, 3-1 and 4-1) may be greater than where both sides of the memory cell are programmed (e.g., 2-3, 2-4, 3-2, 3-3, 3-4, 4-2, 4-3 and 4-4). Excessive charge loss can cause reduction in voltage thresholds and result in read errors and loss of data over time.

The introduction of one or more levels (e.g. level 5) can mitigate charge loss by eliminating use of potentially discordant element pair combinations, such as combinations where only one side of the memory cell is programmed. As shown in FIG. 9, combinations where one side is unprogrammed typically shows a higher charge loss than combinations where both sides are programmed. Replacing the unprogrammed state with a fifth charge or threshold voltage level in such combinations can reduce charge loss. Reducing charge loss would increase data retention, thereby increasing program and erase cycles to which the memory array can be subjected while maintaining acceptable quality levels. Thus, usable life span of the memory arrays can be increased.

Figure 10:
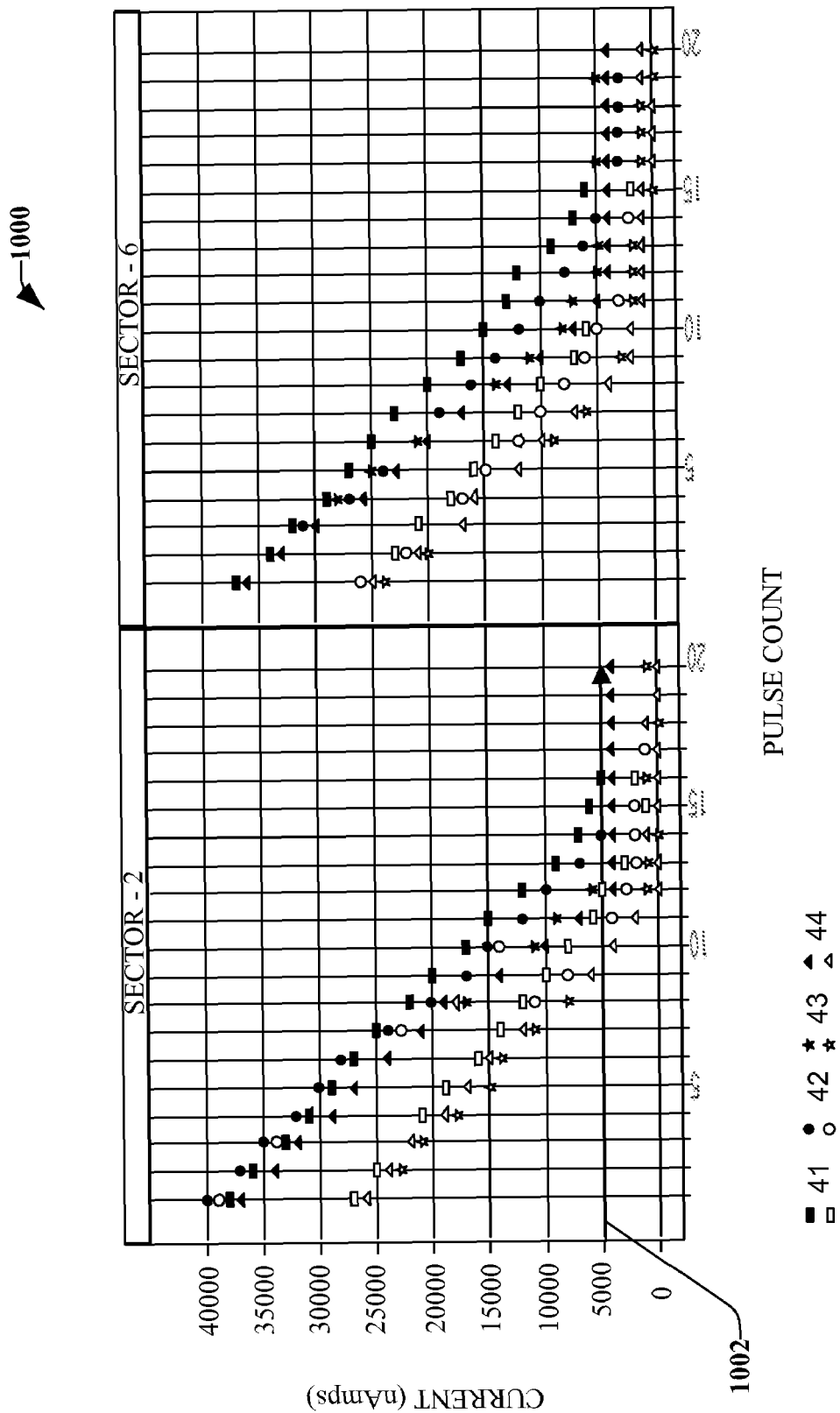
FIG. 10 illustrates effects of various element pair combinations on program time.

Turning now to FIG. 10, programming one element of a memory cell while the other element is unprogrammed can reduce programming speed in addition to reducing data retention. FIG. 10 includes a graph 1000 depicting effects of certain element pair combinations on the number of pulses required to program a memory cell element and consequently the time required to program the memory cell element. One or more charge pulses may be required to program an element of a memory cell. The fewer pulses required to accurately program the memory cell element, the faster the programming speed. The graph 1000 depicts programming pulses required to program in two exemplary sectors of a memory cell array for various element pair combinations (e.g., 4-1, 4-2, 4-3 and 4-4). Here, the vertical axis represents the current measured and the horizontal axis represents the pulse number. The line 1002 with the arrow at 5000 nanoamperes indicates the current at which memory cell elements are typically verified. In general, current decreases as each pulse is applied. When current is reduced below the line 1002, program level is verified and the element is considered programmed. Accordingly, the lowest pulse count where current is below the line is indicative of the number of pulses required to program the memory cell. For instance, as shown in sector 2, the combination of two level four elements (L4-L4) can be programmed using eleven pulses.

Disparities in charge levels for dual elements of a memory cell increase the number of pulses required to program a memory cell, thereby increasing programming time and decreasing memory efficiency. In the example illustrated in the graph 1000, the L4-L4 element pair combination is programmable using eleven pulses, the L4-L3 element pair combination is programmable using twelve pulses, the L4-L2 element pair combination is programmable using fourteen pulses and finally the L4-L1 element pair combination is programmable using sixteen pulses. Introduction of at least one additional charge level can increase programming speed. Replacing the slower programming combinations, L4-L1, L3-L1 with combinations that require fewer program pulses (e.g., L4-L5, L3-L5) would increase programming speed and memory efficiency.

Figure 11:
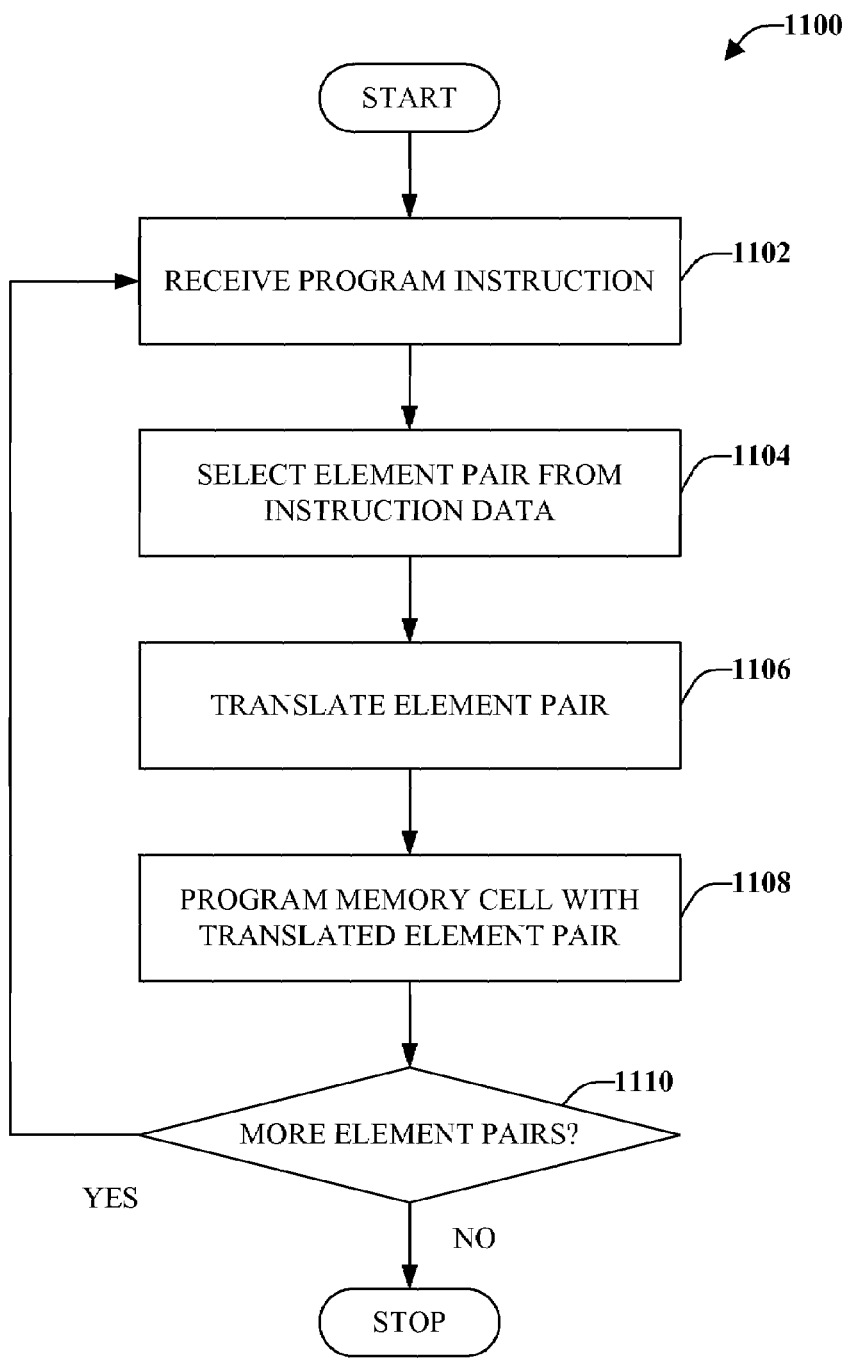
FIG. 11 illustrates an exemplary methodology that facilitates programming a multi-level, dual-element memory cell in accordance with an aspect of the subject matter disclosed herein.
Figure 12:
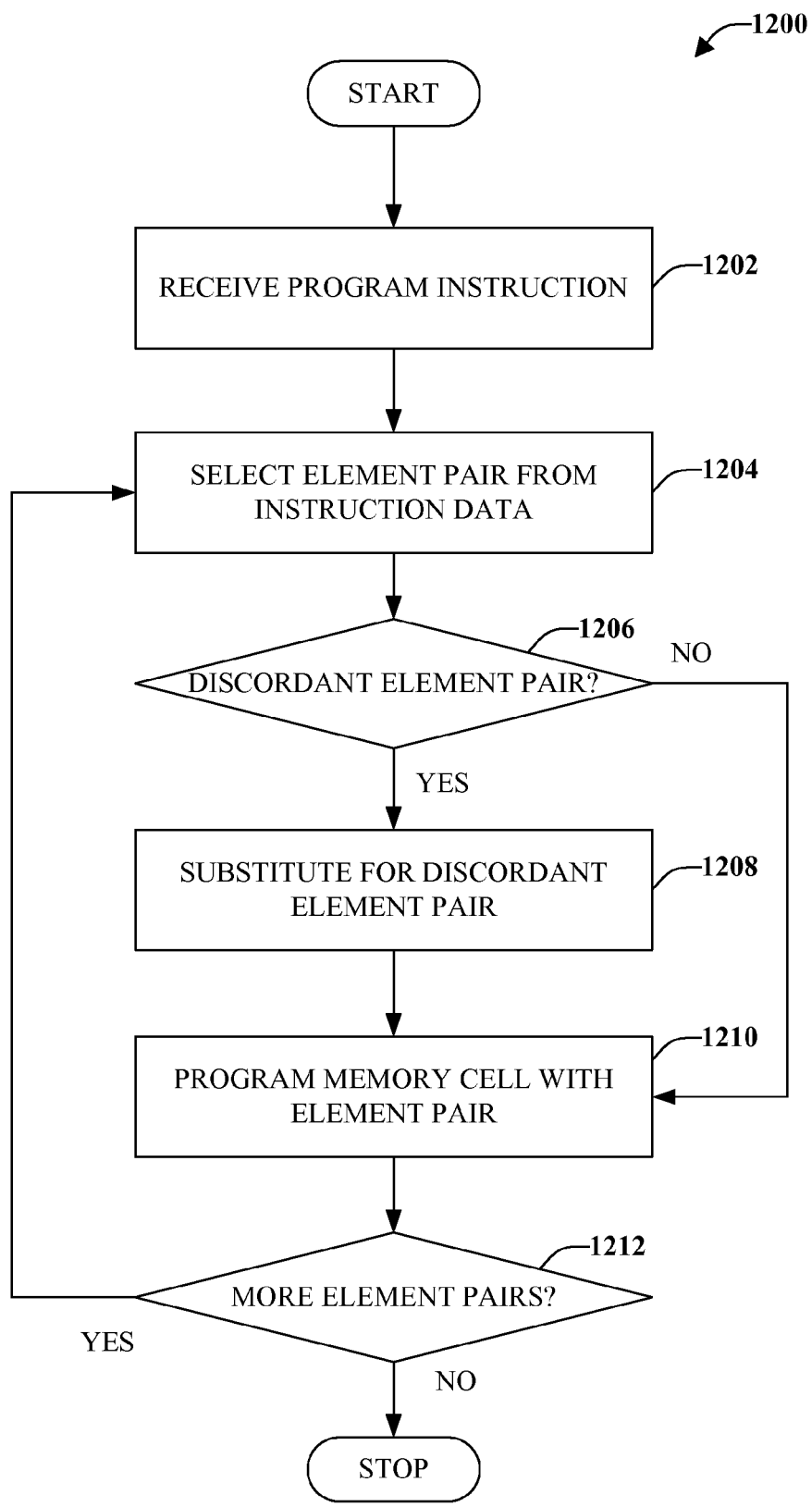
FIG. 12 illustrates an alternate, exemplary methodology that facilitates programming a multi-level, dual-element memory cell in accordance with an aspect of the subject matter disclosed herein.
Figure 13:
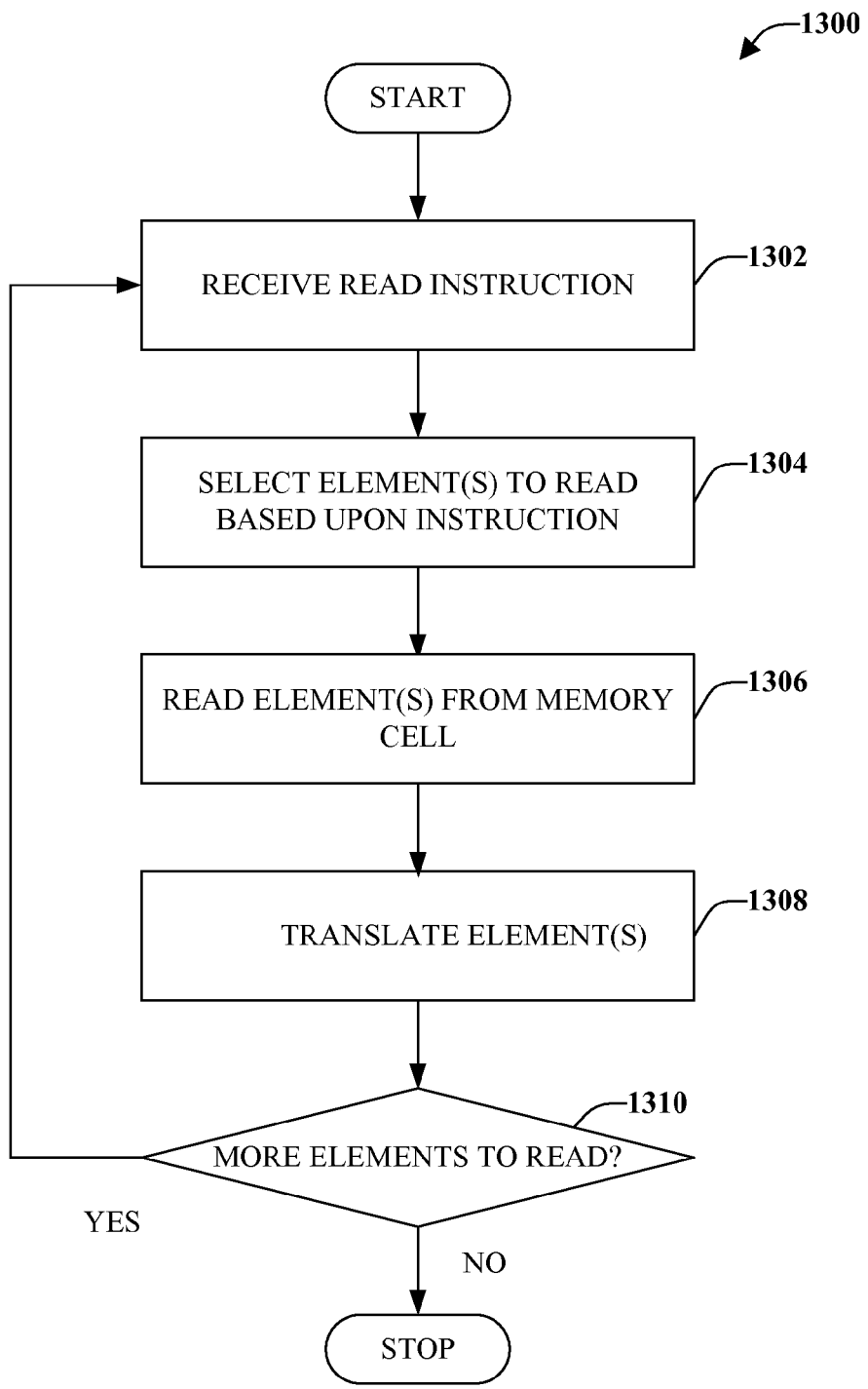
FIG. 13 illustrates an exemplary methodology that facilitates a read operation for a multi-level, dual-element memory cell in accordance with an aspect of the subject matter disclosed herein.

FIGS. 11-13 illustrate methodologies in accordance with the claimed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the claimed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies.

Referring to FIG. 11, a methodology 1100 for programming a multi-level, dual-element memory cell is illustrated. At 1102, a program instruction is received directing programming of a portion of a multi-level, dual element flash memory array. The instruction can include data or element levels to be stored in one or more memory cells of the flash memory array. Before the data can be stored in the array, it should be modified as needed to mitigate complementary bit disturb, state dependent non-uniform charge loss, and state dependent program disturb, improve program time and improve data retention. Data encoded using a first set of levels can be translated and encoded using a larger set of levels to avoid potentially discordant combinations. For instance, data encoded utilizing four levels of charge can be converted and encoded using at least five levels of charge.

At 1104, an element pair is selected for evaluation. Generally, it is the combination of charge levels that causes higher complementary bit disturb, higher state dependent non-uniform charge loss, and higher state dependent program disturb. Accordingly element pairs rather than individual elements are evaluated. The selected element pair can be translated at 1106 to avoid potentially discordant combinations. A predefined lookup table or translation table can be used to automatically replace potentially discordant element pairs during translation. Element pairs not considered potentially discordant may remain unchanged. For example, for an element pair encoded using four levels of charge, where combinations include an unprogrammed state and a high charge value or threshold voltage level (e.g., level 3 or 4), the unprogrammed state can be replaced by an additional level 5 charge. At 1108, the corresponding memory cell is programmed based on the translated element pair. Programming is accomplished by applying multiple programming pulses to each element of the memory cell element-pairs until the threshold voltage of each element generally corresponds to the desired threshold voltage. A determination is made as to whether there are additional element pairs to program to the memory cell array at 1110. If yes, the process selects the next element pair at 1104. Otherwise, the program process terminates.

FIG. 12 illustrates an alternative methodology 1200 for programming a multi-level, dual-element memory cell. At 1202, a program instruction is received directing programming of a portion of a multi-level, dual element flash memory array. Before the data can be stored in the array, it should be converted to mitigate complementary bit disturb, state dependent non-uniform charge loss, and state dependent program disturb, improve program time and improve data retention. Data encoded using a first set of levels can be translated and encoded using a larger set of levels to avoid potentially discordant combinations. For instance, data encoded utilizing four levels of charge can be converted and encoded using at least five levels of charge.

At 1204, an element pair is selected for evaluation. Certain element pair combinations can be identified as potentially discordant and more likely to generate higher complementary bit disturb, state dependent non-uniform charge loss, and state dependent program disturb. For example, combinations of a high charge level and an unprogrammed element may be identified as potentially discordant. At 1206, a determination is made as to whether the selected element pair is potentially discordant. The selected element pair can be compared to a predefined set of potentially discordant combinations (e.g., 1-4, 4-1, 1-3 and 3-1). If the element pair is identified as potentially discordant, at least one of the element values can be replaced using a predefined substitute value at 1208. The substitution can utilize an additional, higher charge level. For instance, an unprogrammed element value can be replaced by a higher level 5 value. The elements of the corresponding memory cell are programmed based upon the element pair at 1210. If the element value was not identified as potentially discordant, the process proceeds directly to 1210, where the corresponding memory cell is programmed with the unmodified element pair values. A determination is made as to whether there are additional element pairs to program to the memory cell array 1212. If yes, the process selects the next element pair at 1204. Otherwise, the program process terminates.

Referring to FIG. 13, a methodology 1300 for reading from a multi-level, dual-element memory cell is illustrated. At 1302, a read instruction is received. At 1304, an element is selected for processing, and at 1306 the selected element is read from a multi-bit memory cell. For a multi-level, multi-bit memory cell, each element can store one of several levels of charge. The amount of charge influences the amount of current that flows between the source and the drain as well as the gate voltage necessary to cause the current to flow. Thus, the level of stored elements can be determined by examining the drain to source currents as well as corresponding applied gate (wordline) voltages. In particular, low currents and high gate voltages can be indicative of higher element levels. Accordingly, measured currents and/or threshold voltages that fall within first, second, third, fourth or fifth ranges may be indicative of level 1, level 2, level 3, level 4 and level 5, respectively for the stored element.

Here, the charge levels read from one or more elements may have been encoded or translated from the original data levels to utilize additional charge levels and mitigate complementary bit disturb, state dependent non-uniform charge loss, and state dependent program disturb. Accordingly, element charge levels can be translated and returned to the original data levels at 1308. A determination is made as to whether there are additional elements to read at 1310. If yes, the process returns to 1302 where the next element or elements are selected. If no, the process terminates During the read operation element values can be evaluated in pairs, or individually, depending upon the translation scheme. Generally, element pairs are evaluated for translation during programming of a memory cell. Accordingly, elements may be evaluated in pairs during translation and return to original data levels. However, certain mapping schemes may allow elements to be evaluated individually during the read operation. For example, if data encoded using four charge levels is programmed in the memory cell utilizing five levels, the fifth level may be used solely to replace the unprogrammed state in certain potentially discordant combinations. For example, for combinations including a high level charge and an unprogrammed state (e.g., 1-3, 3-1, 1-4 and 4-1), the unprogrammed state can be replaced with the additional higher charge, level 5. Accordingly, any instances of level 5 element values can be replaced with level 1 to restore the original data values.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the subject innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Furthermore, the claimed subject matter may be implemented as a method, apparatus, or article of manufacture using standard programming and/or engineering techniques to produce software, firmware, hardware, or any combination thereof to control a memory cell to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter.

What is claimed is:

1. A system that facilitates programming memory utilizing multi-level, multi-bit memory cells, comprising:
    a translation component that maps an element pair encoded using a first set of levels to a second set of levels so as to reduce the occurrence of potentially discordant element pairs, the number of levels in the second set is greater than the first set, the translation component replaces an unprogrammed element with a high threshold voltage level of the second set; and
    a program component that programs at least one element of a multi-bit memory cell based upon the mapped element pair.

2. The system of claim 1, the first set of levels utilizes four distinct threshold voltage levels and the second set of levels utilizes at least five distinct threshold voltage levels.

3. The system of claim 1, further comprising an identification component that identifies the element pair as potentially discordant.

4. The system of claim 3, further comprising a mapping component that maps the potentially discordant element pair to a distinct element pair combination.

5. The system of claim 1, the potentially discordant element pair comprises an unprogrammed element and a high threshold voltage level element.

6. The system of claim 1, further comprising a translation table that maps the first set of levels to the second set of levels.

7. A system that facilitates memory utilizing multi-bit memory cells, comprising:
    a read component that reads at least one element value of a multi-bit memory cell, at least one element value is a function of a first set of levels; and
    a translation component that adjusts the element value as a function of a second set of levels, the second set of levels contains fewer levels than the first set of levels and a mapping from the second set to the first set eliminates a potentially discordant element pair combination wherein an unprogramed state is replaced with the highest level charge.

8. The system of claim 7, the first set utilizes five levels of charge and the second set utilizes four levels of charge.

9. The system of claim 7, the potentially discordant element pair combination includes a high level charge element and a blank level element.

10. The system of claim 7 further comprises a translation table that maps the second set to the first set.

11. A method for programming a multi-level, multi-bit memory cell, comprising:

obtaining an element pair encoded based upon a set of data levels;

translating the element pair to a set of program levels, number of levels in the program set is greater than number of levels in the data set so as to decrease occurrences of potentially discordant combinations;

replacing an unprogrammed state with the highest level charge; and programming the memory cell with the translated element pair.

12. The method of claim 11, the data set includes four levels of charge and the program level of combinations includes five levels of charge.

13. The method of claim 11, farther comprising identifying the element pair as a potentially discordant combination.

14. The method of claim 13, further comprising mapping the potentially discordant combination to the program set utilizing a translation table.

15. The method of claim 14, the potentially discordant combination comprises a combination of an unprogrammed state and a higher level charge.

16. The method of claim 15, the potentially discordant combination includes at least one of a level three element and a level four element.

17. A system for reading a multi-level, multi-bit memory cell, comprising:

means for reading an element value encoded using a first set of levels;

means for adapting the element value to a second set of levels, the number of levels in the first set is greater than number of levels in the second set and a mapping of the second set to the first set eliminates at least one potentially discordant element pair combination; and means for an unprogrammed state with the highest level charge.

18. The system of claim 9, the first set of levels uses five charge levels and the second set of levels utilizes four charge levels.

19. The system of claim 1, an element pair that is not potentially discordant remains unchanged.

20. The system of claim 1, further comprising a voltage generator component that is operable to generate necessary voltages for programming the multi-bit memory cells.

\* \* \* \* \*